US00RE39212E

(19) United States
(12) Reissued Patent
Yokoyama

(10) Patent Number: US RE39,212 E
(45) Date of Reissued Patent: Aug. 1, 2006

(54) ABNORMALITY DETECTION APPARATUS FOR POWER SUPPLY CIRCUIT

(75) Inventor: Hidenori Yokoyama, Toyota (JP)

(73) Assignee: Toyota Jidosha Kabushki Kaisha, Toyota (JP)

(21) Appl. No.: 10/960,895

(22) Filed: Oct. 8, 2004

Related U.S. Patent Documents

Reissue of:
(64) Patent No.: 6,605,946
Issued: Aug. 12, 2003
Appl. No.: 09/643,715
Filed: Aug. 23, 2000

(30) Foreign Application Priority Data

Aug. 25, 1999 (JP) ..... 11-237918

(51) Int. Cl.
*G01R 31/40* (2006.01)
*H02P 11/00* (2006.01)
*H02J 7/00* (2006.01)
*G01N 27/416* (2006.01)

(52) U.S. Cl. ..... 324/429; 324/771; 324/426; 322/25; 320/136

(58) Field of Classification Search ..... 324/429, 324/426, 771, 431; 322/25; 320/136; 702/63; 340/455; 307/10.6, 10.7
See application file for complete search history.

(56) References Cited

U.S. PATENT DOCUMENTS 4,290,109 A * 9/1981 Taniguchi et al. ..... 320/127
4,316,134 A * 2/1982 Balan et al. ..... 322/99
5,272,380 A * 12/1993 Clokie ..... 307/10.7
5,352,971 A * 10/1994 Nishimura ..... 322/27
5,929,609 A 7/1999 Joy et al.
6,262,590 B1 * 7/2001 Yamamoto ..... 324/771
6,294,845 B1 * 9/2001 Yoshida et al. ..... 307/10.6

FOREIGN PATENT DOCUMENTS

| | | | |
|---|---|---|---|
| EP | 0 766 002 A1 | | 4/1997 |
| GB | 2 008 860 A | | 6/1979 |
| JP | 58-23251 A | | 2/1983 |
| JP | 60-152236 A | | 1/1984 |
| JP | 63-65833 | * | 10/1986 |
| JP | 63-65833 A | | 4/1988 |
| JP | 08-338276 | * | 6/1995 |
| JP | 10-047105 | * | 6/1995 |
| JP | 8-103035 A | | 4/1996 |

OTHER PUBLICATIONS

Copy of Japanese Official Action in Japanese Application No. 237918 and partial translation thereof.

* cited by examiner

*Primary Examiner*—Anjan Deb
(74) *Attorney, Agent, or Firm*—Kenyon & Kenyon LLP

(57) ABSTRACT

An abnormality detection apparatus for a power supply circuit associated with an internal combustion engine detects an abnormality that may occur in a power supply circuit, and controls the automatic stop and the automatic start of the engine based on the state of the power supply circuit. The state of charge/discharge of a battery determined based on the electric potential of a terminal located between the battery and a generator-motor or a load is compared with the current through the battery detected by an ammeter. If there is a contradiction therebetween, it is determined that an abnormality has occurred somewhere in the power supply circuit including the battery. When it is determined that the power supply circuit has an abnormality, the apparatus performs such a control as to prevent the automatic stop/start control in which the engine is automatically stopped if a predetermined condition is met, and in which the engine is automatically restarted when the condition is unmet after being met.

13 Claims, 4 Drawing Sheets

ABNORMALITY DETECTION APPARATUS FOR POWER SUPPLY CIRCUIT

Matter enclosed in heavy brackets [ ] appears in the original patent but forms no part of this reissue specification; matter printed in italics indicates the additions made by reissue.

INCORPORATION BY REFERENCE

The disclosure of Japanese Patent Application No. HEI 11-237918 filed on Aug. 25, 1999 including the specification, drawings and abstract is incorporated herein by reference in its entirety.

BACKGROUND OF THE INVENTION

1. Field of the Invention

The invention relates to an abnormality detection apparatus for a power supply circuit associated with a control apparatus for an internal combustion engine. More particularly, the invention relates to an abnormality detection apparatus that detects an abnormality in a power supply circuit having, as a power supply, a chargeable/dischargeable battery connected to a power generator and a load, and an internal combustion engine control apparatus that performs automatic stop/start control of an engine installed in a vehicle, that is, stops the engine when a predetermined condition is met, and restarts the engine when the condition is unmet after being met.

2. Description of the Related Art

An automatic stop/start control apparatus for an internal combustion engine is proposed (in e.g., Japanese Utility Model Application Laid-Open No. SHO 63-65833) which has a battery sensor for detecting an abnormality of a battery. When the battery sensor detects an abnormality of the battery, the apparatus prohibits the automatic stop/start control of the internal combustion engine so as to prevent an automatic stop of the operation of the engine.

In some cases, however, this type of control apparatus fails to automatically restart the internal combustion engine. For example, if there is a contact failure in a power supply circuit that includes the battery, electric power is not supplied to a self-starting motor for starting the internal combustion engine even though the battery sensor does not detect an abnormality of the battery. Therefore, once the engine is automatically stopped with such an undetected power supply circuit failure, the engine cannot be automatically restarted.

SUMMARY OF THE INVENTION

Accordingly, it is an object of the power supply circuit abnormality detection apparatus of the invention to detect an abnormality that may occur in a power supply circuit and to direct the control of the automatic stop and the automatic start of an internal combustion engine with an internal combustion engine control apparatus, based on the state of a power supply circuit.

To achieve the aforementioned and other objects, one aspect of the invention provides an abnormality detection apparatus for a power supply circuit having a chargeable battery connected to a generator, the apparatus including a controller. The controller determines a state of the generator, determines a state of the battery, and determines that the power supply circuit is normal, (a) when the generator is in a generating state (where the generator is able to charge the battery) and the battery is in a charged state, or (b) when the generator is in a non-generating state and the battery is in a discharged state.

According to the above-described aspect, it is possible to determine whether the power supply circuit has an abnormality based on a combination of the state of the generator and the state of charge/discharge of the battery.

In the above-described aspect, the abnormality detection apparatus may further include a current detector that detects a current through the battery, wherein the controller detects an electric potential of at least a portion of a wiring connecting between the generator and at least one of the generator and a load, and wherein the controller detects an abnormality of the power supply circuit based on the electric potential detected and the current detected by the current detector. Therefore, it becomes possible to detect an abnormality including an abnormality related to an electrical connection. It also becomes possible to detect whether the battery is reversely connected and whether the engine is started by jump start.

Another aspect of the invention provides an abnormality detection apparatus for a power supply circuit of an internal combustion engine installed in a vehicle, the apparatus including an abnormality detection apparatus for a power supply circuit as described above and an engine controller. The engine controller automatically stops the internal combustion engine when a predetermined condition is met. The engine controller restarts the internal combustion engine when the predetermined condition is unmet after being met. When the abnormality detection apparatus determines that the power supply circuit has an abnormality, an automatic stop/start of the internal combustion engine is prohibited.

Therefore, when an abnormality is detected in the power supply circuit, the abnormality detection apparatus does not permit the automatic stop/start control apparatus of the internal combustion engine to stop/start the engine. Hence, the apparatus avoids an inconvenience where the engine cannot be automatically restarted.

BRIEF DESCRIPTION OF THE DRAWINGS

The foregoing and further objects, features and advantages of the invention will become apparent from the following description of a preferred embodiment with reference to the accompanying drawings, wherein like numerals are used to represent like elements and wherein.

DETAILED DESCRIPTION OF PREFERRED EMBODIMENT

A preferred embodiment of the invention will be described hereinafter with reference to the accompanying drawings.

Figure 1:
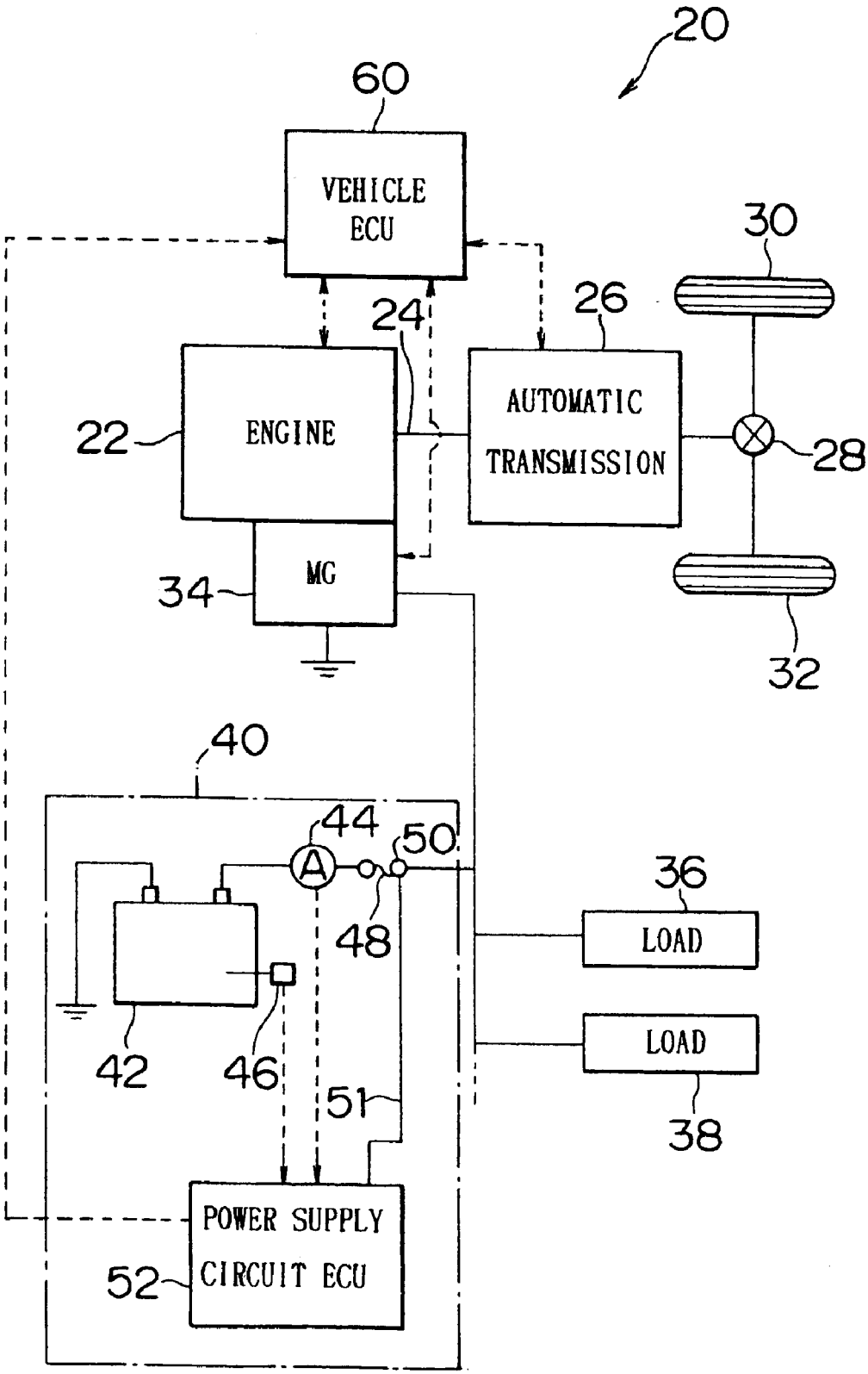
FIG. 1 is a schematic illustration of a construction of an engine automatic stop/start control apparatus and an abnormality detection apparatus for a power supply circuit according to an embodiment of the invention.

FIG. 1 is a schematic illustration of a construction of an abnormality detection apparatus 40 for a power supply circuit and a construction of an automatic stop/start control apparatus 20 for an engine 22. As shown in FIG. 1, the automatic stop/start control apparatus 20 includes the engine 22 driven through the use of gasoline as a fuel, and an automatic transmission 26 that changes the speed of rotation transmitted from a crankshift 24 which is an output shaft of the engine 22, and that outputs torque to drive wheels 30, 32 connected to the automatic transmission 26 via a differential gear 28. The automatic stop/start control apparatus 20 also includes a generator-motor 34 that starts the engine 22 by rotating the crankshaft 24 and that generates electric power from drive power from the crankshaft 24, and a battery 42 that is charged by the generator-motor 34 and that supplies power to the generator-motor 34 and loads 36, 38. The automatic stop/start control apparatus 20 further includes a power supply circuit ECU 52 that determines whether the power supply circuit including the battery 42 has an abnormality, and a vehicle ECU 60 that performs overall controls.

A fuse 48 is connected to a positive terminal of the battery 42 via an ammeter 44 that detects the current IB through the battery 42. A terminal 50 of the fuse 48 is connected to the generator-motor 34 and the loads 36, 38. The terminal 50 of the fuse 48 is connected to the power supply circuit ECU 52 by an electrically conductive line 51, so that the electric potential VB of the terminal 50 can be detected by the power supply circuit ECU 52. The battery 42 is provided with a temperature sensor 46 that detects the temperature T inside the battery 42. The temperature sensor 46 is connected to the power supply circuit ECU 52 by an electrically conductive line. The negative terminal of the battery 42 is grounded.

Although not shown in the drawings, the power supply circuit ECU 52 is formed as a microcomputer having a CPU as a main component. The power supply circuit ECU 52 has a ROM storing processing programs, a RAM for temporarily storing data, input/output ports, and the like. The power supply circuit ECU 52 accepts as an input signals representative of the current IB from the ammeter 44, the battery temperature T from the temperature sensor 46, and the like, via the input port. The power supply circuit ECU 52 outputs a result of an abnormality determination with respect to the power supply circuit as a control signal via the output port. Furthermore, although not shown, the power supply circuit ECU 52 has therein a voltmeter connected to the electrically conductive line 51 and to the ground, so that the electric potential difference between the terminal 50 and the ground can be detected.

Although not shown in the drawings, the vehicle ECU 60 is formed as a microcomputer having a CPU as a main component, as is the case with the power supply circuit ECU 52. The vehicle ECU 60 has a ROM storing processing programs, a RAM for temporarily storing data, input/output ports, and the like. The vehicle ECU 60 accepts input of control signals from the power supply circuit ECU 52, and signals from various sensors that are disposed in the engine 22, the automatic transmission 26, the generator-motor 34 and the like, via the input port. The vehicle ECU 60 outputs drive signals to driver devices of appliances that are needed to operate the engine 22, the automatic transmission 26, the generator-motor 34, and the like, via the output port.

As for the hardware construction of the power supply circuit abnormality detection apparatus 40, the apparatus 40 is formed by the ammeter 44 that detects the current through the battery 42, the temperature sensor 46 that detects the temperature T inside the battery 42, the electrically conductive line 51 provided for detecting the electric potential of the terminal 50 provided at a predetermined location on the wiring extending from the battery 42 to the generator-motor 34 and to the loads 36, 38, and the power supply circuit ECU 52.

The operation of the automatic stop/start control apparatus 20 will next be described.

The power supply circuit abnormality detecting operation of the abnormality detection apparatus 40 for the power supply circuit will be described first, and the automatic stop/start control process using results of the abnormality detecting operation will be described later.

Figure 2:
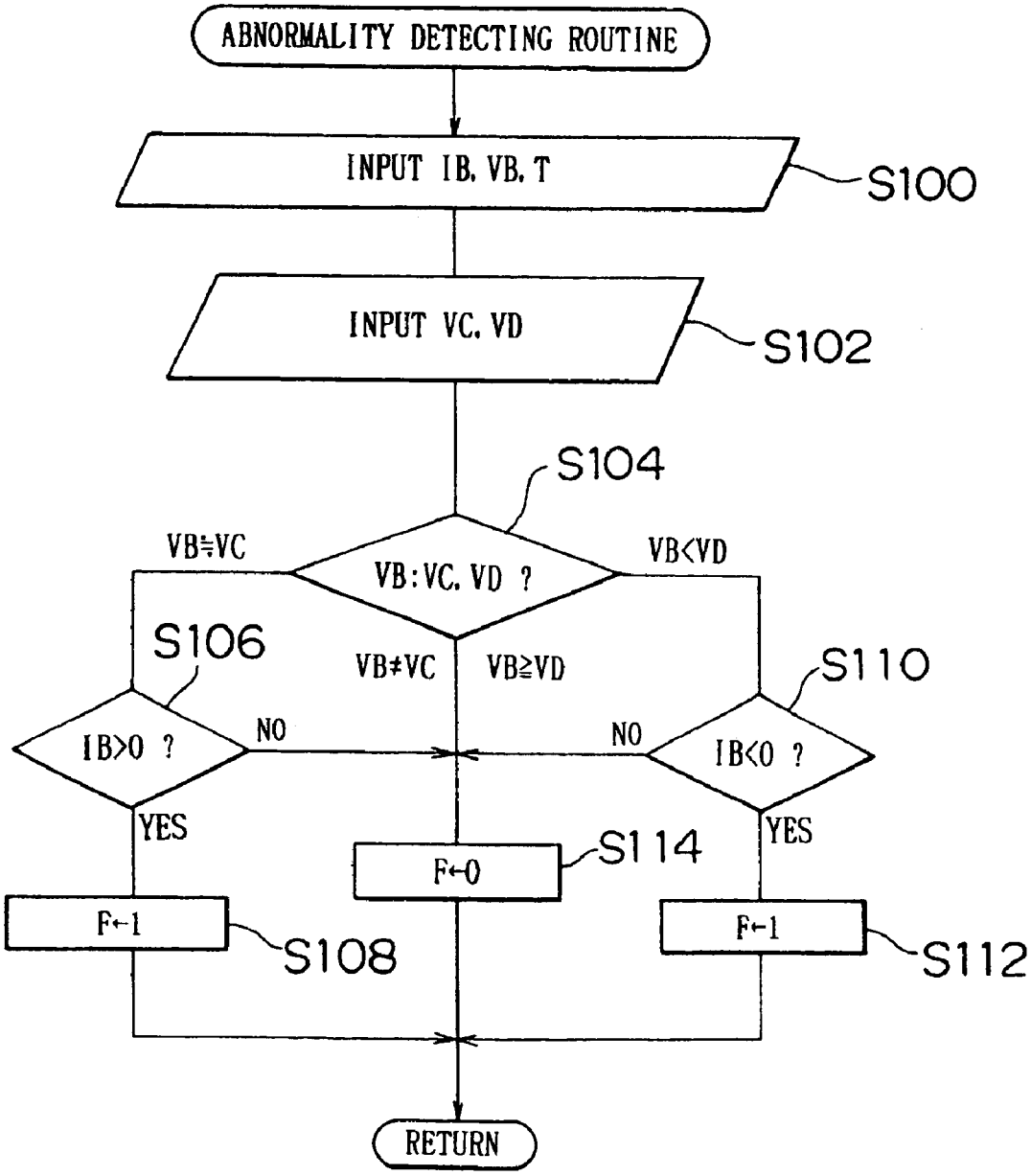
FIG. 2 is a flowchart illustrating an abnormality detecting routine executed by a power supply circuit ECU.

FIG. 2 is a flowchart illustrating an example of an abnormality detecting routine executed by the power supply circuit ECU 52. This routine is repeatedly executed at every predetermined time (e.g., every minute) after the engine of the vehicle is started. When the routine is executed, the CPU of the power supply circuit ECU 52 first executes a process of reading the current IB through the battery 42 detected by the ammeter 44, the electric potential VB of the terminal 50, and the temperature T of the battery 42 detected by the temperature sensor 46 (step S100).

Figure 3:
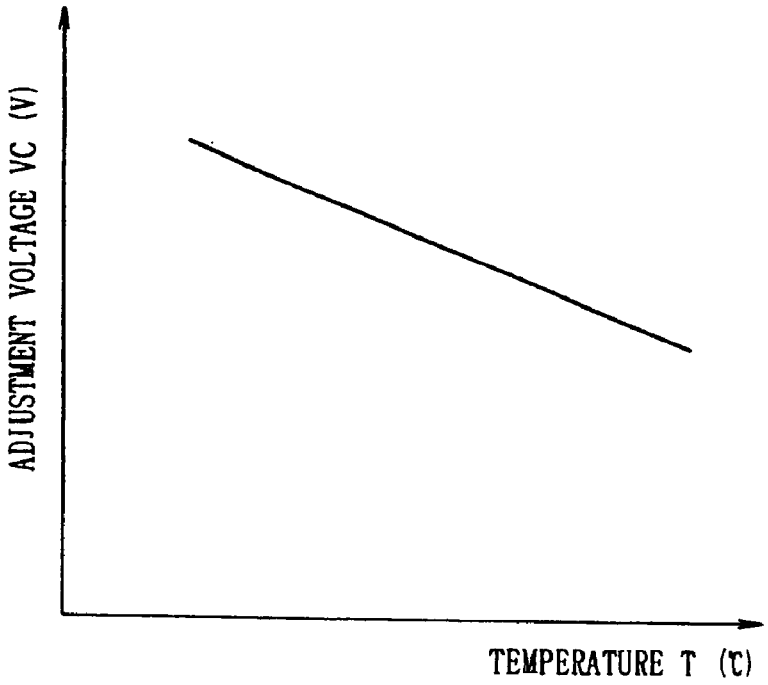
FIG. 3 is a graph indicting a relationship between the battery temperature and the adjustment voltage for charging the battery.
Figure 4:
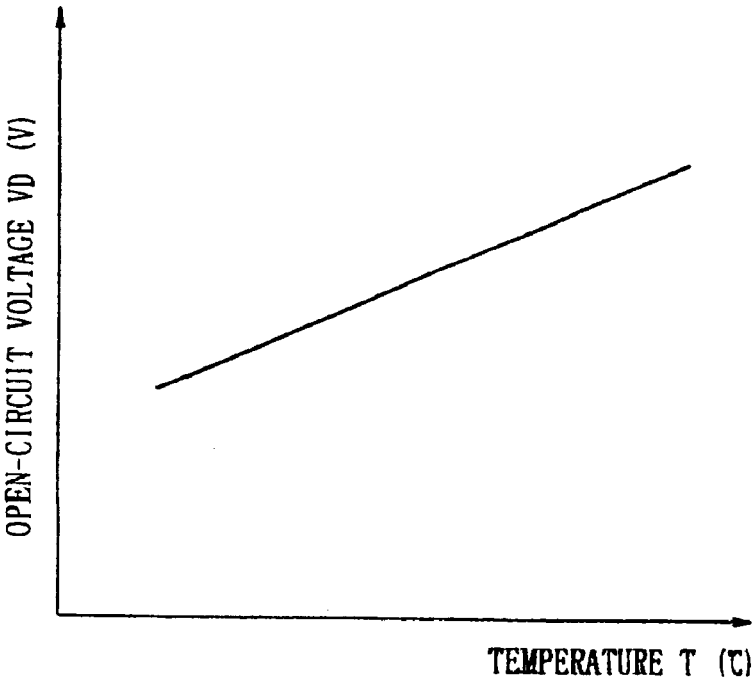
FIG. 4 is a graph indicting a relationship between the battery temperature and the open-circuit voltage of the battery.

Next, the CPU executes a process of reading the open-circuit voltage VD of the battery 42 and the adjustment voltage VC for charging the battery 42 based on the battery temperature T read as mentioned above (step S102). The adjustment voltage VC for charging is a voltage set as a generation voltage of the generator-motor 34 in order to properly charge the battery 42. In this embodiment, the adjustment voltage VC is set so as to decrease with increases in the temperature T of the battery 42 as exemplified in FIG. 3. The relationship between the adjustment voltage VC and the temperature T of the battery 42 is determined by the condition of use, the kind of the battery, and the like. The open-circuit voltage VD of the battery 42 is the electric potential difference between the output terminals of the battery 42 occurring when the terminals are not connected to any load. In general, the open-circuit voltage VD and the temperature T of the battery 42 have a relationship that the open-circuit voltage VD increases with increases in the temperature T of the battery 42 as exemplified in FIG. 4. The relationship between the open-circuit voltage VD and the temperature T of the battery 42 is also determined by the kind of the battery, and the like. In this embodiment, the relationship between the adjustment voltage VC for charging the battery 42 and the temperature T of the battery 42, and the relationship between the open-circuit voltage VD of the battery 42 and the temperature T of the battery 42 are stored in the form of maps in the ROM provided in the power supply circuit ECU 52. When a temperature T of the battery 42 is given, the corresponding adjustment voltage VC and the corresponding open-circuit voltage VD are derived from the maps.

After deriving the adjustment voltage VC and the open-circuit voltage VD, the CPU executes a process of comparing the electric potential VB of the terminal 50 read in step S100 with the adjustment voltage VC and the open-circuit voltage VD (step S104). If the electric potential VB of the terminal 50 is substantially equal to the adjustment voltage VC with an error allowed within a predetermined range, the CPU determines that the generator-motor 34 is generating power for charging the battery 42. The CPU then checks the sign of the current IB flowing through the battery 42, that is, positive or negative (step S106). In this embodiment, the current occurring when the battery 42 is being discharged is determined as a positive current. Therefore, if the current IB is negative, the CPU determines that the battery 42 is being normally charged, and then sets a value of zero in an abnormality determination flag F (step S114). After that, the CPU ends the routine. Conversely, if the current IB is positive, the current IB indicates a discharged state although the generator-motor 34 is in a power generating state, so that the CPU determines that the power supply circuit has an abnormality. The CPU then sets a value of 1 in the abnormality determination flag F (step S108). After that, the CPU ends the routine. The abnormality determination flag F is set to zero by an initializing routine that is executed when the engine of the vehicle is started.

If the electric potential VB of the terminal 50 is less than the open-circuit voltage VD, the CPU determines that the generator-motor 34 is not in the generating state for charging the battery 42, and then checks the sign of the current IB flowing through the battery 42, that is, positive or negative (step S110). If the current IB is positive, the CPU determines that the battery 42 is being normally discharged, and then sets zero in the abnormality determination flag F (step S114). Then, the CPU ends the routine. Conversely, if the current IB is negative, the current IB indicates a charged state although the generator-motor 34 is not in the generating state, so that the CPU determines that the power supply circuit has an abnormality. The CPU then sets "1" into the abnormality determination flag F (step S112). Then, the CPU ends the routine. If the electric potential VB of the terminal 50 is not equal to the adjustment voltage VC but is equal to or greater than the open-circuit voltage VD, the CPU sets zero into the abnormality determination flag F (step S114), and then ends the routine.

The above-described abnormality detection apparatus 40 for the power supply circuit is able to detect an abnormality that is possible to occur in the power supply circuit, based on the electric potential VB at the predetermined location (terminal 50) between the battery 42 and the generator-motor 34 or the loads 36, 38, and the current IB through the battery 42. More specifically, the abnormality detection apparatus 40 is able to determine whether the power supply circuit has an abnormality, based on whether there is a contradiction between the state of power generation of the generator-motor 34 determined based on the electric potential VB of the terminal 50 and the state of charge/discharge of the battery 42 determined based on the current IB flowing through the battery 42. Furthermore, since the abnormality detection apparatus 40 derives the adjustment voltage VC and the open-circuit voltage VD by using the temperature T of the battery 42, the apparatus 40 is able to more precisely detect an abnormality of the power supply circuit.

Furthermore, the power supply circuit abnormality detection apparatus 40 of the embodiment is able to detect a reversed connection of the battery 42, a jump-start, or the like as an abnormality. In the case of a reversed connection of the battery 42, a current IB flows into the battery 42, that is, indicates the charged state, when the generator-motor 34 is not the generating state. Therefore, the reversed connection can be detected as an abnormality. At the time of a jump-start, a voltage generated in the rescue car is supplied to the terminals of the battery 42, so that a voltage indicating a predetermined power-generating state is detected at the terminal 50, and the current IB flows out of the battery 42, that is, indicates the discharged state. Thus, the jump-start can be detected as an abnormality.

Although in the abnormality detection apparatus 40 for the power supply circuit in the embodiment, "1" is set in the abnormality determination flag F when it is determined that the power supply circuit has an abnormality, it is also possible to turn a warning lamp on or produce a voice message in addition to setting "1" in the abnormality determination flag F.

Although in the embodiment, the adjustment voltage VC and the open-circuit voltage VD are derived from the temperature T of the battery 42, it is also possible to perform detection of an abnormality by using an adjustment voltage VC and a open-circuit voltage VD provided with latitudes and by omitting the use of the temperature T although this detection method has a slightly reduced precision in abnormality detection.

The automatic stop/start control process will next be described.

Figure 5:
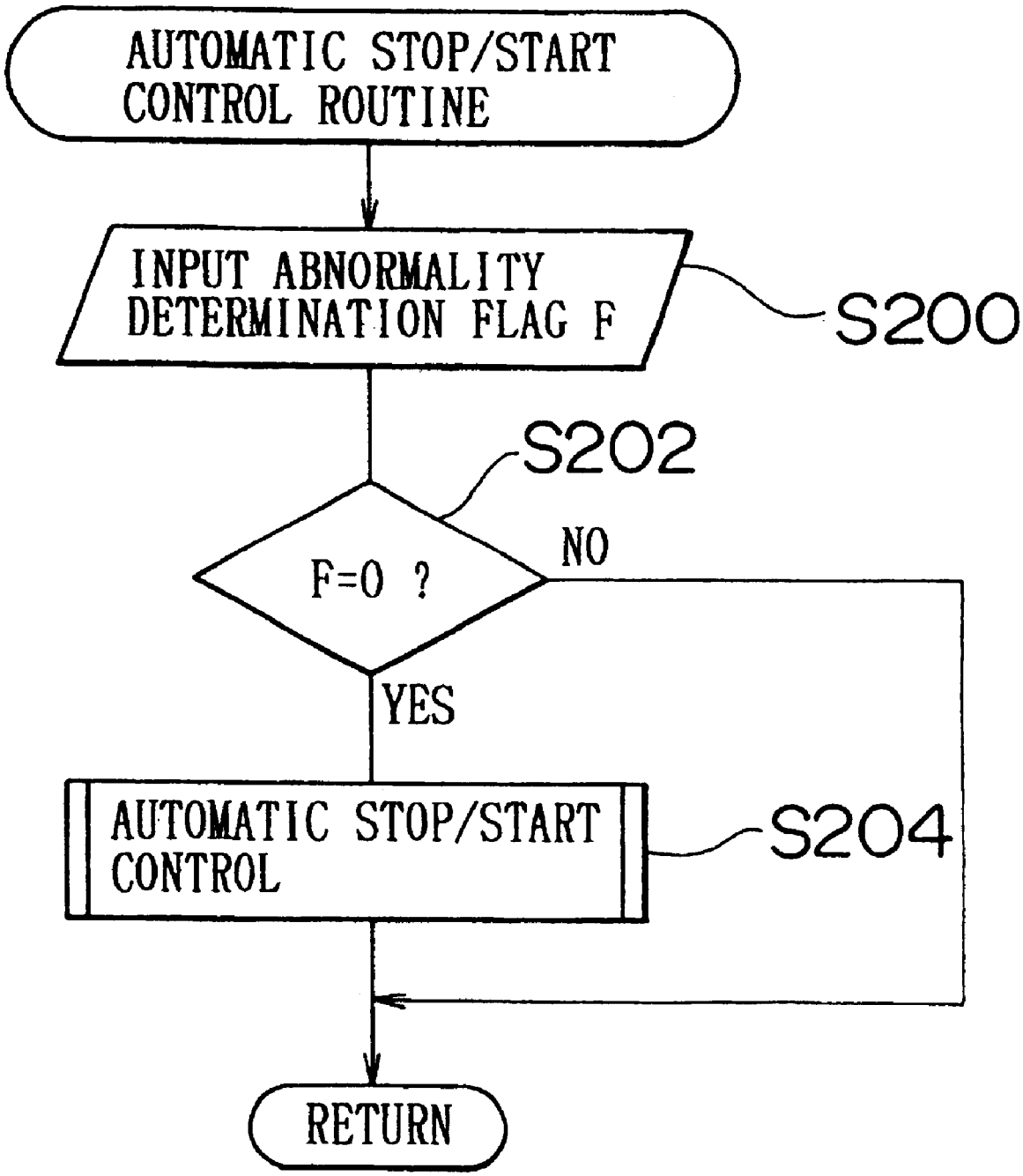
FIG. 5 is flowchart illustrating an automatic stop/start control routine executed by a vehicle ECU in the embodiment of the invention.

FIG. 5 is a flowchart illustrating an example of an automatic stop/start control routine executed by the vehicle ECU 60. This routine is repeatedly executed at predetermined length of time (e.g., every 8 msec) after the engine of the vehicle is started.

When this routine is executed, the CPU of the vehicle ECU 60 first executes a process of reading the abnormality determination flag F set in the abnormality detecting routine exemplified in FIG. 2 (step S200). More specifically, the CPU accesses a predetermined address in the RAM of the power supply circuit ECU 52 at which the abnormality determination flag F is written. After reading the abnormality determination flag F, the CPU checks the value thereof (step S202). If the value is zero, the CPU determines that the power supply circuit has no abnormality, and then executes a normal automatic stop/start control (step S204). After that, the CPU ends the routine. The automatic stop/start control is a control in which the operation of the engine 22 is stopped by stopping the fuel supply to the engine 22 and the ignition control when a predetermined condition (e.g., a condition that the brake fluid pressure is at least a predetermined value while the vehicle is in a stopped state, a condition that a hand brake (or an emergency brake) is engaged or the shift position is the P position while the vehicle is in the stopped state, or the like) is met, and in which the engine 22 is restarted by driving the generator-motor 34 when the predetermined condition is unmet after being met.

If the value of the abnormality determination flag F is "1", the CPU of the vehicle ECU 60 determines that the power supply circuit has an abnormality, and then ends the routine without executing the automatic stop/start control. This is because when the power supply circuit has an abnormality, power cannot be supplied from the battery 42 to the generator-motor 34 in some cases. In such cases, once the operation of the engine 22 is stopped, the engine 22 cannot be restarted by the automatic stop/start control.

The automatic stop/start control apparatus 20 according to the invention does not perform the automatic stop/start control of the engine 22 when the power supply circuit has an abnormality. Therefore, the apparatus is able to avoid the inconvenience where, after being stopped, the engine 22 cannot be restarted.

While the invention has been described with reference to what is presently considered to be a preferred embodiment thereof, it is to be understood that the invention is not limited to the disclosed embodiment or constructions. On the contrary, the invention is intended to cover various modifications and equivalent arrangements.

What is claimed is:

1. An abnormality detection apparatus for a power supply circuit having a chargeable battery connected to a generator, comprising:

a power supply circuit controller, which determines a state of the generator;

determines a state of the battery; and determines that the power supply circuit is normal when the generator is in a generating state and the battery is in a charged state or when the generator is in a non-generating state and the battery is in a discharged state.

2. An abnormality detection apparatus according to claim 1, further comprising a current detector that detects a current through the battery, wherein the power supply circuit controller detects an electric potential of at least a portion of a wiring connecting between the power supply circuit and at least one of the generator and a load, and the power supply circuit controller detects an abnormality of the power supply circuit based on the electric potential detected and the current detected by the current detector.

3. An abnormality detection apparatus according to claim 2, wherein the power supply circuit controller determines the state of the generator based on the electric potential detected.

4. An abnormality detection apparatus according to claim 3, wherein the power supply circuit controller determines that the generator is in a generation capable state when the electric potential detected is equal to a predetermined electric potential.

5. An abnormality detection apparatus according to claim 4, wherein the predetermined electric potential is determined based on an output electric potential set in the generator.

6. An abnormality detection apparatus according to claim 5, further comprising a temperature detector that detects a temperature of the battery, wherein the power supply circuit controller sets the predetermined electric potential based on the temperature detected by the temperature detector.

7. An abnormality detection apparatus for a power supply circuit according to claim 1, further comprising:

an engine controller *for controlling an internal combustion engine*, wherein said engine controller automatically stops the internal combustion engine when a predetermined condition is met and automatically restarts the internal combustion engine when the predetermined condition is unmet after being met; and wherein an automatic stop/restart of the internal combustion engine is prohibited when the power supply circuit controller determines that the power supply circuit has an abnormality.

8. An abnormality detection method for a power supply circuit having a chargeable battery connected to a generator, the method comprising:

determining a state of the generator;

determining a state of the battery; and determining that the power supply circuit is normal when the generator is in a generating state and the battery is in a charged state or when the generator is in a non-generating state and the battery is in a discharged state.

9. [A] *An* abnormality detection method according to claim 8, further comprising:

detecting a current through the battery;

detecting an electric potential of at least a portion of a wiring connecting between the power supple circuit and at least one of the generator and a load; and determining whether the power supply circuit has an abnormality based on the electric potential detected and the current detected by the current detector.

10. An abnormality detection method according to claim 9, wherein the state of the generator is determined based on the electric potential detected.

11. An abnormality detection method according to claim 10, wherein it is determined that the generator is in a generation capable state when the electric potential detected is equal to a predetermined electric potential.

12. An abnormality detection method according to claim 11, wherein the predetermined electric potential is determined based on an output electric potential set in the generator.

13. An abnormality detection method according to claim 12, further comprising:

detecting a temperature of the battery; and changing the predetermined electric potential based on the temperature detected.

* * * * *